United States Patent [19]

Zirngibl

[11] Patent Number: 5,390,200
[45] Date of Patent: Feb. 14, 1995

[54] HIGH POWER, SINGLE-FREQUENCY TUNABLE LASER

[75] Inventor: Martin Zirngibl, Middletown, N.J.

[73] Assignee: AT&T Corp., Murray Hill, N.J.

[21] Appl. No.: 135,836

[22] Filed: Oct. 13, 1993

[51] Int. Cl.$^6$ .............................................. H01S 3/10
[52] U.S. Cl. ........................................ 372/20; 372/50; 372/32; 385/46
[58] Field of Search ..................... 372/20, 50, 29, 32, 372/28; 385/46, 39

[56] References Cited

U.S. PATENT DOCUMENTS

| | | | |
|---|---|---|---|
| 5,002,350 | 3/1991 | Dragone | 350/96 |
| 5,136,671 | 8/1992 | Dragone | 385/46 |
| 5,267,257 | 11/1993 | Saruwatari et al. | 372/20 |

*Primary Examiner*—Georgia Y. Epps
*Attorney, Agent, or Firm*—Gregory C. Ranieri; Stuart H. Mayer

[57] ABSTRACT

A monolithically integrated laser which is rapidly tunable over a wide optical frequency range comprises a frequency router formed in a semiconductive wafer defining a tuned cavity. A control circuit applies electrical energy to predetermined controllably transmissive waveguides connecting the frequency routing device with reflective elements defined in the wafer. This tunes the laser to a desired one of a plurality of optical frequencies. Application of such electrical energy creates frequency selective pathways through the wafer able to support selected lasing frequencies. Additional optical amplifiers are formed in the frequency router to create lasing action in a preselected pathway. This laser is economical to construct and is useful in high capacity, high speed optical communications networks.

10 Claims, 2 Drawing Sheets

HIGH POWER, SINGLE-FREQUENCY TUNABLE LASER

CROSS-REFERENCE TO RELATED APPLICATIONS

This application is related to application Ser. No. [Glance-Wilson 22-2] of Bernard Glance and Robert Wilson, entitled "Rapidly Tunable Integrated Optical Filter".

This application is related to application Ser. No. [Glance-Wilson 22-3] of Bernard Glance and Robert Wilson, entitled "Rapidly Tunable Wideband Integrated Optical Filter".

This application is related to application Ser. No. [Glance-Wilson 22-4] of Bernard Glance and Robert Wilson, entitled "Rapidly Tunable Wideband Integrated Laser".

This application is related to application Ser. No. [Dragone-Kaminow 34-41] of Corrado Dragone and Ivan Kaminow, entitled "Rapidly Tunable Integrated Laser".

This application is related to application Ser. No. [Glance-Wilson 27-7] of Bernard Glance and Robert Wilson, entitled "Optical Passband Filter", filed in the Patent and Trademark Office on the same day this application is being filed.

TECHNICAL FIELD

This invention relates to optical communications systems. More particularly, this invention relates to lasers used in optical communications systems.

BACKGROUND

The capacity and speed of communications systems may be increased by transmitting information in optical form over networks composed of optically transmissive nodes, fibers, waveguides, and the like. High capacity optical communications systems require that many optical signals be frequency division multiplexed in the components of an optical network. This requires that there be a way of conveniently producing electromagnetic energy at many different frequencies. An ideal device for producing optical energy useful in an optical communications system is a laser. Until now, there has been no convenient approach to creating a large number of high power optical frequencies with lasers. The performance of prior lasers have been limited in terms of tuning speed, frequency selectivity, or tuning range. All of these prior devices also have been expensive to implement.

SUMMARY

In accordance with this invention, a rapidly tunable laser has been developed which provides a well-defined set of frequencies at a high output power. This laser may be based upon photonic integrated circuitry which has a wide gain bandwidth. Such tunable lasers can be realized at a cost lower than that needed to implement prior lasers used in optical communications systems.

In one example of the invention, a tunable laser is provided which employs integrated optical multiplexers and demultiplexers that incorporate optical amplifiers. Examples of such multiplexers and demultiplexers are disclosed in U.S. Pat. Nos. 5,002,350 and 5,136,671. The devices disclosed therein, which do not incorporate the optical amplifiers employed by the invention, may be used to create a monolithic laser rapidly tunable over a wide frequency range.

In specific terms, one example of the invention comprises an NxN frequency routing device formed on a semiconductive wafer between two reflective faces. Waveguides associated with the device each contain an integrated optical amplifier selectively acting as a gate which is either optically opaque to prevent the flow of optical energy through a respective waveguide or optically transparent with perhaps some gain depending on the level of the bias current. By selectively activating these optical amplifiers frequency selective pathways can be defined between the reflective faces. Each pathway is such that lasing action is supported at a particular selected frequency. The frequency routing device incorporates optical ampitiers in each of its waveguides of the waveguide grating. The lasing signal, which is distributed approximately equally among all the grating arms, is thus amplified by the optical amplifiers. This increases the total output power of the laser approximately M-fold, where M is the number of grating arms, as compared to the laser which does not have amplifiers in the waveguide grating. The laser is rapidly tunable to any of N frequencies equal to the number of input or output waveguides associated with the frequency routing device.

This is only an example of the invention. The full scope of the invention entitled to an exclusionary fight is set forth in the claims at the end of this application.

DETAILED DESCRIPTION

Figure 1:
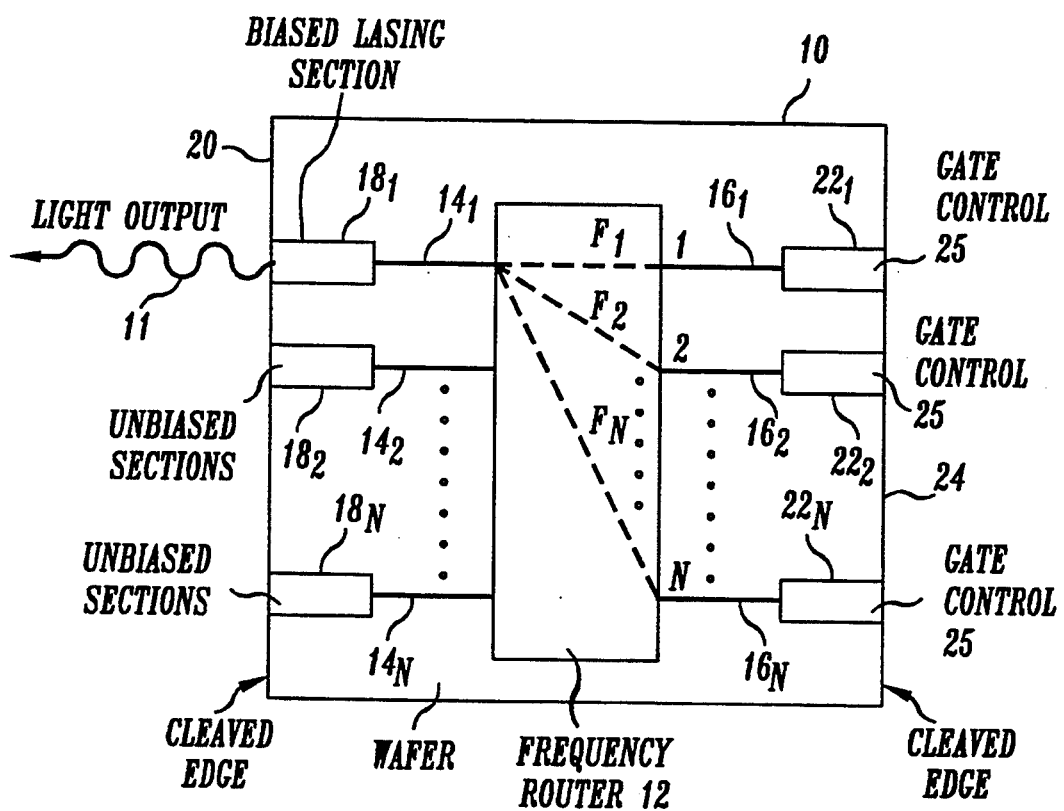
FIG. 1 is a diagram of an example of a tunable laser in accordance with this invention.

FIG. 1 shows an example of a laser which is rapidly tunable over a wide frequency range. It is composed of a frequency routing device for providing frequency selectivity, a number of waveguides for carrying optical signals, and a number of optically active sections for providing optical amplification and lasing behavior. These structures may be monolithically integrated on a semiconductive wafer. They may be created by means of known photolithographic techniques.

FIG. 1 illustrates a wafer 10 made of a semiconductive material such as an indium phosphide based material such as InGaAsP. An NxN frequency routing device 12 is defined on the wafer 10. A first plurality of waveguides $14_1, 14_2, \ldots, 14_N$ is connected to one end of the frequency routing device 12. A second plurality of waveguides $16_1, 16_2, \ldots, 16_N$ is connected to another end of the frequency routing device 12. A first plurality of optical amplifiers $18_1, 18_2, \ldots, 18_N$ connects respective ones of the first plurality of waveguides to a cleaved face 20 formed in the semiconductive wafer 10. A second plurality of waveguides $22_1, 22_2, \ldots, 22_N$ connects respective ones of the second plurality of waveguides to a second cleaved face 24 formed in the wafer 10. The two cleaved faces 20 and 24 comprise reflective mirrors defining an optical cavity in which lasing action can be supported. A gate control circuit 25 selectively provides bias current to predetermined ones of the optical amplifiers to produce laser light at one of N discrete frequencies as indicated at reference numeral 11 in FIG. 1.

Each optical amplifier comprises a doped section of waveguide with controllable optical transmissivity. The doping may be such that an appropriately configured semiconductor junction is defined in each optical amplifier. These sections are optically active in that application of electrical energy to those sections will cause them to become transmissive to the flow of optical energy and will even provide some degree of gain to optical signals flowing through them. When electrical bias current above a lasing threshold is applied, laser action begins. These doped sections of waveguide are substantially opaque to the transmission of light when there is no applied electrical stimulation. The specially doped sections thus may be considered to be gates or optical amplifiers depending upon whether or not they are excited with electrical energy. The details of creating such sections in a wafer such as the wafer 10 shown in FIG. 1 are generally known, are not a part of this invention, and thus are not described here.

Selectively applying bias current to predetermined ones of the optical amplifiers in FIG. 1 will create certain frequency selective optical pathways between the cleaved faces 20 and 24 due to the behavior of the frequency routing device 12. Application of a certain amount of bias current above a lasing threshold to the selected ones of the optical amplifiers will cause lasing action at a frequency supported in the frequency selective optical pathways. Those optical amplifiers which are not given any bias current remain opaque to the transmission of optical energy through them.

The frequency routing device 12 is such that an optical signal having a frequency $F_1$ appearing on the waveguide $14_1$ and flowing toward the device 12 will be directed to the waveguide $16_1$. An optical signal having a frequency $F_1$ directed toward the frequency routing device 12 on waveguide $16_1$ will be directed to the waveguide $14_1$. An optical signal having a frequency $F_2$ appearing on waveguide $14_1$ and flowing toward the device 12 will be directed to the waveguide $16_2$. An optical signal having a frequency $F_2$ directed toward the frequency routing device 12 on waveguide $16_2$ will be directed toward waveguide $14_1$. In general, an optical signal having a frequency $F_i$ appearing on waveguide $14_1$ and flowing toward the device 12 will be directed to a waveguide $16_i$ by the frequency routing device. Similarly, an optical signal having a frequency $F_i$ appearing on a waveguide $16_i$ and flowing toward the frequency routing device 12 will be directed to waveguide $14_1$.

The edges of the wafer at the ends of the two sets of optical amplifiers are cleaved to form reflective mirrors with a tunable cavity between them. The amplifiers on one side of the frequency routing device 12 are used as gates opened by the bias current. When these gates are biased by a current of 10 to 20 mA, for example, these gates become optically transparent with perhaps some gain depending on the level of the bias current. They are highly optically lossy at a zero bias current. One of these optical amplifiers on one side of the wafer 10 is biased so that it is optically transmissive. The other optical amplifiers on the same side are unbiased. On the other side of the frequency routing device 12, one of the optical amplifiers is biased above a lasing threshold. The remaining amplifiers are unbiased to absorb any light reaching them. Application of bias current to the optical amplifiers in this manner determines a transparent route between the mirrors for lasing action. Along this route, stationary waves can be sustained for frequencies within a passband associated with this route. Frequencies outside this passband are suppressed by the lossy unbiased optical amplifiers. Lasing occurs at the Fabry-Perot mode whose frequency is nearest the passband maximum. Adjacent Fabry-Perot modes are suppressed by passband selectivity which can be adjusted by appropriate circuit design. There are N passbands $\Delta F$ wide repeated periodically with a free spectral range (FSR) period $N\Delta F$. Assuming that the gain of the active semiconductive medium peaks sufficiently over one of these FSRs, N lasing frequencies can be obtained in this FSR by appropriate activation of selected optical amplifiers in the wafer 10. Frequencies outside this FSR are suppressed by gain discrimination. Tuning can thus be achieved at discrete frequencies separated by intervals $\Delta F$ over a tuning range $N\Delta F$. In addition, combinations of lasing frequencies can be obtained by activating more than one amplifier section on one side of the device 12. Furthermore, amplifier sections can be modulated in order to send information.

Described here are a couple of examples illustrating how the laser of FIG. 1 may be tuned to a plurality of discrete optical frequencies. If it is desired that the laser of FIG. 1 produce optical energy at a frequency $F_1$, bias current is applied to optical amplifier $18_1$ and optical amplifier $22_1$. The bias current applied to the optical amplifier $22_1$ is above the lasing threshold for the semiconductor material. An optically transmissive path is thereby defined between the reflective faces 20 and 24 comprising the optical amplifier $18_1$, the waveguide $14_1$, the frequency routing device 12, the waveguide $16_1$, and the optical amplifier $22_1$. An optical standing wave is created between the faces 20 and 24 at the frequency $F_1$ and laser light at that frequency is output by the device of FIG. 1 as shown by reference numeral 11. In this case, face 20 may be partially transmissive and face 24 may be totally reflective. Similarly, if it is desired that the laser of FIG. 1 produce optical energy at a frequency $F_2$, bias current is applied to the optical amplifier $18_1$ and the optical amplifier $22_2$. The bias current applied to the optical amplifier $22_2$ is above the lasing threshold for the semiconductor material. An optically transmissive path is thereby defined between the faces 22 and 24 comprising the optical amplifier $18_1$, the waveguide $14_1$, the frequency routing device 12, the waveguide $16_2$, and the optical amplifier $22_2$. An optical standing wave is created between the faces 20 and 24 at the frequency $F_2$ and laser light at that frequency is output by the device of FIG. 1 as shown by reference numeral 11. Optical energy at frequencies $F_3$ to $F_N$ may be produced by activating optical amplifiers $22_3$ to $23_N$, respectively, instead of activating the optical amplifiers $22_1$ or $22_2$. The output frequency produced by the laser in FIG. 1 may rapidly be changed by changing which optical amplifiers receive bias current.

Figure 2:
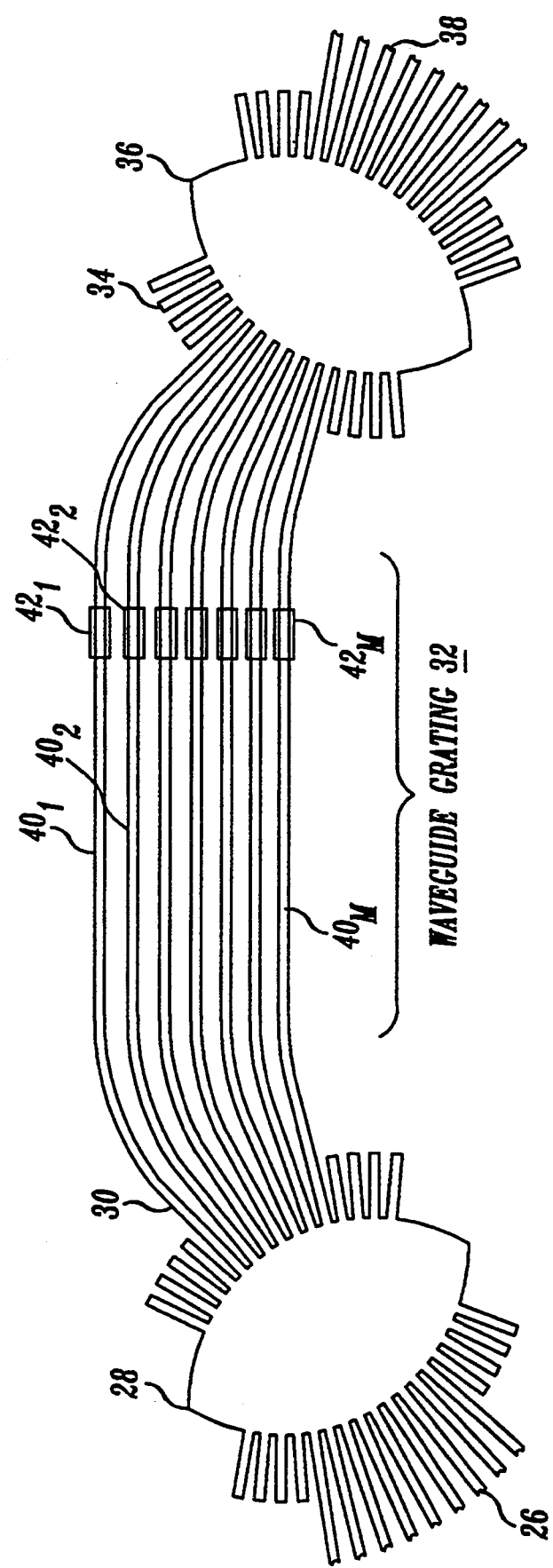
FIG. 2 is a diagram illustrating the details of the frequency routing device shown in FIG. 1.

FIG. 2 shows the pertinent details of an example of a routing device 12 shown in FIG. 1. The frequency routing device contains a plurality of input waveguides 26 connected to a free space region 28. A plurality of output waveguides 30 extends from the free space region 28 and is connected to an optical waveguide grating 32. The optical waveguide grating 32 comprises a plurality of unequal length waveguides $40_1$, $40_2$, . . . , $40_M$, which provides a predetermined amount of path length difference between the output waveguides 30 and a corresponding plurality of input waveguides 34 connected to another free space region 36. Each of the grating waveguides $40_1, 40_2, \ldots, 40_M$ contains an optical amplifier $42_1, 42_2, \ldots, 42_M$. The free space region 36 is connected to a plurality of output waveguides 38. These frequency routing devices operate as multiplexers and demultiplexers of optical frequencies. The details of their construction and operation are more fully described in the U.S. patents referred to above, the entire contents of which are hereby incorporated by reference into this application. In the case of the frequency routing device 12 in FIG. 1, the input waveguides 26 may be connected to the waveguides $14_1, 14_2, \ldots, 14_N$, respectively. The plurality of output waveguides 38 are connected to the waveguides $16_1, 16_2, \ldots, 16_N$ in the device of FIG. 1.

The output power of the tunable laser can be substantially increased by applying to each of the M grating waveguides $40_1, 40_2, \ldots, 40_M$ an electrical bias current above a lasing threshold. The gain supplied by each of the grating waveguides $40_1, 40_2, \ldots, 40_M$ is coupled together in a loss free manner in the free space regions 28 and 36 of the frequency routing device 12. Accordingly, because the total gain is the sum of the gain from each of the M grating waveguides, the output power of the tunable laser is increased over a similar tunable laser which does not incorporate an optical amplifier in each of grating waveguides. Moreover, the tunable laser can achieve very high output powers because only 1/M of the output power causes gain saturation in each of the optical amplifiers $42_1, 42_2, \ldots 42_M$ provided in the grating waveguides $40_1, 40_2, \ldots 40_M$. The tunable laser is also highly reliable since it employs M different gain sections positioned in parallel to one another and hence a failure of any one gain section simply reduces the output power by 1/M.

The laser of FIG. 1 may be tuned to a large number of different optical frequencies used in high speed, high capacity optical communications networks. For example, frequency routing devices with N up to 32 or more may be conveniently fabricated on a single semiconductive wafer. This results in a tunable laser which can be tuned to any of up to 32 or more optical frequencies. For example, a laser using a 32×32 frequency routing device providing passbands spaced by 50 GHz will yield 32 potential frequencies of operation distributed regularly at 50 GHz intervals over a tuning bandwidth of 1600 GHz. This bandpass is thus 60% larger than that of a conventional DBR laser. The doped sections comprising the optical amplifiers in FIG. 1 may be switched on or off at up to nanosecond speeds thereby resulting in rapid tuning of the FIG. 1 laser to the desired frequencies. Devices such as the laser in FIG. 1 are attractive for large size optical network applications based on frequency division multiplexing.

In one alternative to the device shown in FIG. 1, a mirror image of the FIG. 1 device could be attached along a plane defined by face 24 in FIG. 1, in which case, high quality laser mirrors are required only adjacent two optical amplifiers, for example, amplifier $18_1$ and its mirror image.

Figure 3:
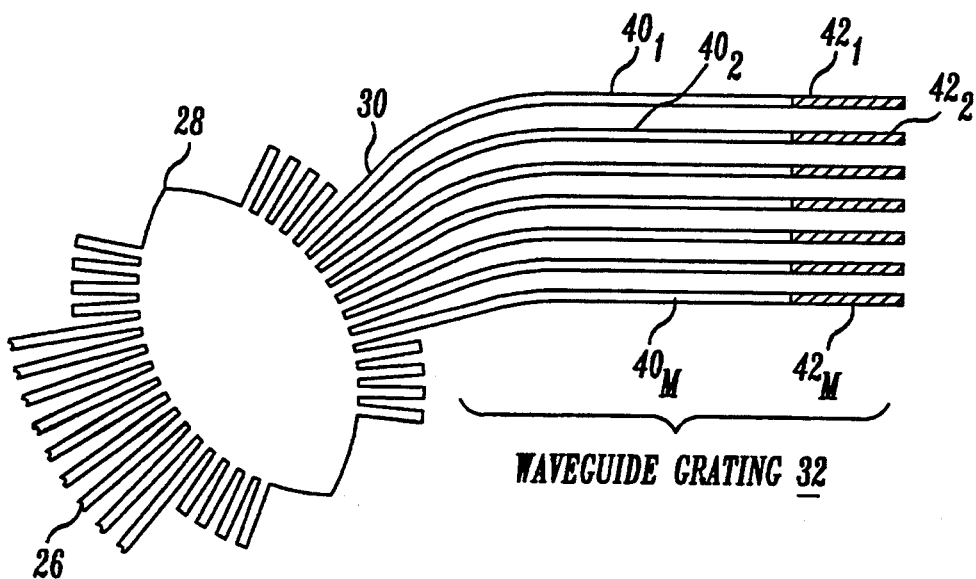
FIG. 3 is a diagram illustrating the details of an alternative example of the frequency routing device shown in FIG. 1.

In another alternative to the device shown in FIG. 1, a frequency routing device is employed which has only one free space region. An example of such a device is shown in FIG. 3. In this case the routing device contains a plurality of input waveguides 26 connected to a free space region 28, which is in turn connected to an optical grating 32. The optical grating 32 comprises a plurality of unequal length grating waveguides $40_1, 40_2, \ldots, 40_M$ which each contain an optical amplifier $42_1, 42_2, \ldots, 42_M$. The grating waveguides $40_1, 40_2, \ldots, 40_M$ are connected to the output waveguides $16_1, 16_2, \ldots, 16_N$ seen in FIG. 1, or alternatively, are directly connected to one of the cleaved faces 20 and 24 formed in the wafer 10.

I claim:

1. A tunable laser, comprising:
   a laser cavity defined in a semiconductor wafer; and
   a frequency routing device formed in the cavity;
   a plurality of frequency selective optically transmissive pathways definable in the laser cavity, each of said frequency selective pathways having a first plurality of optical amplifiers which are selectively activatable to define a predetermined frequency selective pathway in the laser cavity; and
   a second plurality of optical amplifiers disposed in said frequency routing device for creating lasing action in the predetermined frequency selective pathway and means for providing bias current to the first and second plurality of optical amplifiers.

2. The tunable laser of claim 1, further comprising:
   a control circuit for selectively activating the first plurality of optical amplifiers to define the predetermined frequency selective pathway in the laser cavity.

3. The tunable laser of claim 1, in which the frequency routing device comprises:
   at least one input waveguide;
   a first free space region connected to the at least one input waveguide;
   a plurality of output waveguides connected to the fast free space region;
   an optical grating connected to the plurality of output waveguides comprising a plurality of unequal length waveguides, each of said unequal length waveguides having one of said second plurality of optical amplifiers connected in series therewith;
   a plurality of input waveguides connected to the optical grating;
   a second free space region connected to the plurality of input waveguides connected to the optical grating; and
   a plurality of output waveguides connected to the second free space region.

4. The tunable laser of claim 1, in which the frequency routing device comprises:
   at least one input waveguide;
   a first free space region connected to the at least one input waveguide;
   a plurality of output waveguides connected to the first free space region;
   an optical grating connected to the plurality of output waveguides comprising a plurality of unequal length waveguides, each of said unequal length waveguides having one of said second plurality of optical amplifiers connected in series therewith; and
   a plurality of output waveguides connected to the plurality of unequal length waveguides of the optical grating.

5. A tunable integrated laser, comprising:
   a frequency routing device having at least one optical amplifier incorporated therein, said frequency routing device formed in a semiconductive wafer;
   first and second spaced reflective surfaces formed in the wafer;

a first plurality of waveguides connecting the first reflective surface to the frequency routing device;

a second plurality of waveguides connecting the frequency routing device to the second reflective surface;

a controllable optical amplifier in series with each of the first and second pluralities of waveguides; and means for providing bias current to selected ones of the controllable optical amplifiers for tuning the laser to a predetermined output optical frequency.

6. The tunable integrated laser of claim 5 further comprising:

means for providing bias current to said at least one optical amplifier incorporated in said frequency routing device to create lasing action.

7. A laser cavity comprising:

a laser cavity defined in a semiconducter wafer; and a frequency routing device formed in the cavity;

a plurality of frequency selective optically transmissive pathways definable in the laser cavity, each of said frequency selective pathways having a first plurality of optical amplifiers which are selectively activatable to define a predetermined frequency selective pathway in the laser cavity: and a second plurality of optical amplifiers disposed in said frequency routing device for creating lasing action in the predetermined frequency selective pathway.

8. The laser cavity of claim 7, further comprising:

a control circuit for selectively activating the first plurality of optical amplifiers to define the predetermined frequency selective pathway in the laser cavity.

9. The laser cavity of claim 7, in which the frequency routing device comprises:

at least one input waveguide:

a first free space region connected to the at least one input waveguide;

a plurality of output waveguides connected to the first free space region;

an optical grating connected to the plurality of output waveguides comprising a plurality of unequal length waveguides, each of said unequal length waveguides having one of said second plurality of optical amplifiers connected in series therewith;

a plurality of input waveguides connected to the optical grating;

a second free space region connected to the plurality of input waveguides connected to the optical grating; and a plurality of output waveguides connected to the second free space region.

10. The laser cavity of claim 7, in which the frequency routing device comprises:

at least one input waveguide:

a first free space region connected to the at least one input waveguide;

a plurality of output waveguides connected to the first free space region;

an optical grating connected to the plurality of output waveguides comprising a plurality of unequal length waveguides, each of said unequal length waveguides having one of said second plurality of optical amplifiers connected in series therewith; and a plurality of output waveguides connected to the plurality of unequal length waveguides of the optical grating.

* * * * *